United States Patent [19]
Ishikawa

[11] Patent Number: 4,722,041
[45] Date of Patent: Jan. 26, 1988

[54] SWITCHING REGULATOR

[75] Inventor: Hiroichi Ishikawa, Saitama, Japan

[73] Assignee: Toko, Inc., Tokyo, Japan

[21] Appl. No.: 924,018

[22] Filed: Oct. 28, 1986

[30] Foreign Application Priority Data

Oct. 31, 1985 [JP] Japan .................. 60-244997
Dec. 24, 1985 [JP] Japan .................. 60-291552

[51] Int. Cl.$^4$ .................................. H02M 3/338
[52] U.S. Cl. ........................ 363/18; 363/56; 323/289
[58] Field of Search .......... 363/18, 19, 131, 56; 323/289; 331/112

[56] References Cited

U.S. PATENT DOCUMENTS 153,463 9/1884 Sakuma .................. 363/18
4,207,478 6/1980 Marumoto et al. .......... 323/289 X

FOREIGN PATENT DOCUMENTS 71655 6/1977 Japan .................. 363/19
169362 9/1984 Japan .................. 363/18

Primary Examiner—Patrick R. Salce
Assistant Examiner—Kristine L. Peckman

[57] ABSTRACT

An on-on type switching regulator comprises a blocking oscillator, rectifying-smoothing circuit, and a voltage drop circuit. The blocking oscillator includes a transformer having a collector winding, base winding and secondary winding, and a transistor. The rectifying-smoothing circuit comprises a rectifier diode, flywheel diode, choke coil, and smoothing capacitor, and is connected to the secondary winding. The voltage drop circuit is connected in a closed circuit which is formed between the base winding and the base-emitter of said transistor, said voltage drop circuit being arranged to block any forward or backward current when the voltage thereacross is in a micro-voltage range which may occur before excitation energy in the choke coil is discharged.

4 Claims, 7 Drawing Figures

SWITCHING REGULATOR

BACKGROUND OF THE INVENTION

1. Field of the Invention

This invention relates to a self-excited on-on type switching regulator.

2. Description of the Prior Art

Switching regulators can be generally classified into two types, i.e., self-excited type and separately-excited type. The separately-excited type has high freedom of design and is adaptable for all specifications, but is expensive, while the self-excited type has only limited freedom of design but is suitable when it is desired to reduce cost. The self-excited type of power transformation usually employs the flyback type and rarely uses the on-on type. This is because with the on type, difficulty is encountered in an attempt to balance a current which is caused to flow from a choke coil of a rectifying-smoothing circuit to a load when an oscillation transistor is in an "off" state, and excitation energy which is accumulated in the choke coil when the oscillation transistor is in an "on" state. More specifically, in a self-excited oscillator circuit such as blocking oscillator circuit or the like, an oscillation transistor will be turned on when magnetic flux in an oscillation transformer becomes extinct, but with a certain load, it may happen that excitation is effected while magnetic flux still remains in the choke coil. If such a condition occurs repeatedly, the choke coil will be saturated with magnetic flux, so that when the oscillation transistor is turned on, an excessive surge current resulting from excitation energy of the choke coil will be caused to flow through the transistor. For this reason, it is difficult to protect the transistor from being damaged by the excessive surge current. However, the flyback type requires a larger transformer since a current which is caused to flow through the secondary winding of a transformer is about twice as high as that in the on-on type. The on-on type is preferred.

SUMMARY OF THE INVENTION

It is an object of the present invention to provide a self-excited on-on type switching regulator using a blocking oscillator circuit including a choke coil and transistor, the switching regulator being designed such that after magnetic flux in the choke coil has become extinct so that excitation energy has been completely discharged, the transistor is turned on and thus protected from being damaged.

Another object of the present invention is to provide such a switching regulator which is designed such that by detecting the collector current of the oscillation transistor with the aid of a current transformer, the output current can be prevented from increasing even if the load becomes so heavy as to be out of the control range.

According to an aspect of the present invention, there is provided an on-on type switching regulator comprising a blocking oscillator including a transformer having a collector winding, base winding and secondary winding, and a transistor; a rectifying-smoothing circuit comprising a rectifier diode, flywheel diode, choke coil, and smoothing capacitor, said rectifying-smoothing circuit being connected to said secondary winding; and a voltage drop circuit connected in a closed circuit formed between said base winding and the base-emitter of said transistor, said voltage drop circuit being arranged to block any forward or backward current when the voltage thereacross is in a micro-voltage range which may occur before excitation energy in said choke coil is discharged.

Other objects, features and advantages of the present invention will become apparent from the ensuing description taken in conjunction with the accompanying drawings.

DESCRIPTION OF THE PREFERRED EMBODIMENTS

Figure 1:
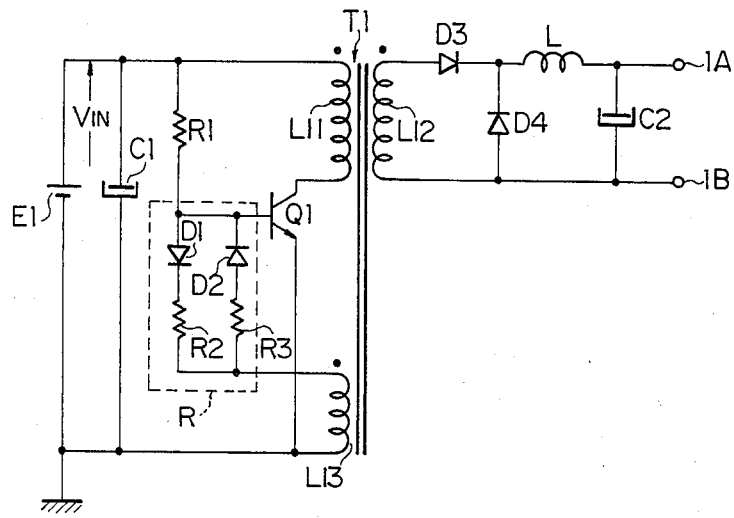
FIG. 1 is a circuit diagram showing the switching regulator according to an embodiment of the present invention.
Figure 2:
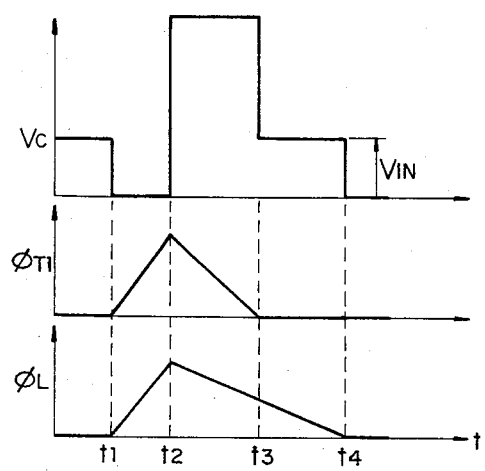
FIG. 2 is a view useful for explaining the operation of the switching regulator shown in FIG. 1.

Referring to FIG. 1, there is shown the circuit arrangement of the switching regulator according to an embodiment of the present invention, and referring to FIG. 2, there are shown the collector voltage Vc of an oscillation transistor Q1 (FIG. 1), the magnetic flux $\phi_{T1}$ of a transformer T1 (FIG. 1), and the magnetic flux $\phi_L$ of a choke coil L (FIG. 1).

Figure 7:
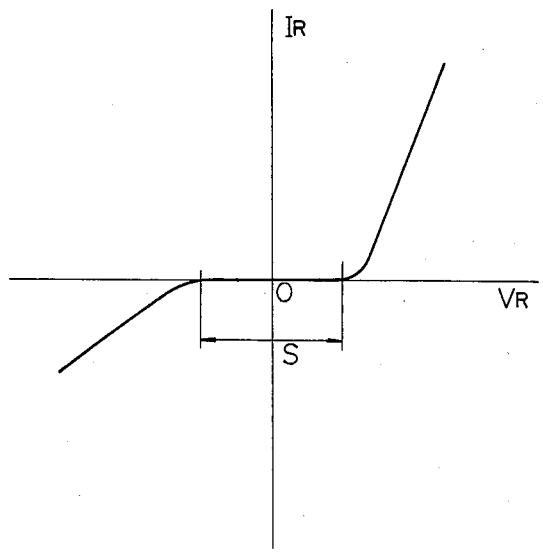
FIG. 7 is a view showing the characteristic of a voltage drop circuit.

In FIG. 1, there is provided a blocking oscillator circuit which comprises the oscillation transistor Q1; and the transformer T1 having a primary winding L11 (referred to as collector winding hereinafter) connected at one end to the collector of the transistor Q1, a secondary winding L12, and a ternary winding L13 (referred to as base winding hereinafter) connected at one end to the base of the transistor Q1 through a first series circuit of a diode D1 and resistor R2 and a second series circuit of a diode D2 and resistor R3 connected in parallel with the first series circuit, said base winding L13 being also connected at the other end to the emitter of the transistor Q1, wherein a closed circuit is defined between the base and the emitter of the transistor Q1 through the base winding L13. As will be explained hereinafter, the diodes D1 and D2 and resistors R2 and R3 constitute a voltage drop circuit R which is arranged to stop any current which tends to flow in the forward or backward direction when the voltage across the voltage drop circuit R is in a micro-voltage range such as shown at S in FIG. 7. The base of the transistor Q1 is connected to the non-grounded terminal of an input capacitor C1 which is connected in parallel with a DC power source E1, and also to the other end of the primary winding L11 of the transformer T1. The series circuit of the diode D1 and resistor R2, together with the resistor R1, serves to adjust an input voltage which is applied to the base of the transistor Q1 when the latter is rendered conductive.

Connected to the secondary winding L12 are a rectifier diode D3, choke coil L, flywheel diode D4, and smoothing capacitor C2.

Voltage $V_R$ across the voltage drop circuit R is set up in accordance with the following expression:

$$V_R > \{N_3(V_3 - V_4)/N_2\} 31 V_{BE} \ldots \quad (1)$$

where $V_3$ is a forward voltage with which the rectifier diode D3 is turned on; $V_4$ is a forward voltage with which the flywheel diode D4 is turned on; $V_{BE1}$ is a base voltage with which the transistor Q1 is turned on; $N_3$ is the number of turns of the base winding L13 of the transformer T1; and $N_2$ is the number of turns of the secondary winding L12 of the transformer T1. In the above expression (1), the first term $N_3(V_3-V_4)/N_2$ at the right hand side represents an induced voltage which tends to be induced in the base winding L13 of the transformer T1 when a current is flowing through the choke coil L and flywheel diode D4. The voltage drop circuit R serves to prevent current $I_R$ from flowing when the voltage $V_R$ thereacross is in a micro-voltage range such as shown at S in FIG. 7.

The operation of the switching regulator having the above-mentioned construction will now be described with reference to FIG. 2 in which the abscissa axis represents time t.

Because of only a small base current flowing through the resistor R1, a collector current will be caused to flow through the transistor Q1. A voltage will be induced in the base winding L13 of the transformer T1 under the action of the mutual inductance with respect to the collector winding L11, so that the base voltage of the transistor Q1 will be thereby biased forwardly. In this way, the collector current of the transistor Q1 will be increased to be higher than before, and the increased collector current will serve to increase the voltage induced in the base winding L13 so that the base current will become higher, thus further increasing the collector current.

Because of the above regenerative action, the transistor Q1 will be turned on at time t1 so that the collector current will continue to increase. The base current of the transistor Q1 will be limited by the resistor R3 in due course of time, so that the collector current will now be stopped from increasing, and as a result, the magnetic flux $\phi_{T1}$ will no longer change, so that the voltage induced in the base winding L13 of the transformer T1 will now begin decreasing. As the base current decreases, the collector current will decrease, and because of regenerative action reverse to the previous one, the transistor Q1 will be abruptly turned off at time t2.

Until time immediately prior to the time t2 when the transistor Q1 is turned off, an excitation current will continue to flow through the collector winding L11 of the transformer T1 so that the magnetic flux $\phi_{T1}$ will be accumulated therein; thus, because of the transistor Q1 being abruptly turned off, a counter electromotive force will be generated so that the transistor Q1 will be thereby biased reversely.

The reversely biased condition will persist until time t3 when the magnetic flux $\phi_{T1}$ becomes extinct.

When the transistor Q1 is in the "on" state, a current which will charge the smoothing capacitor C2 through the rectifier diode D3 and choke coil L, will be caused to flow through the secondary winding L12. Meanwhile, the magentic flux $\phi_L$ will be accumulated in the choke coil L as excitation energy.

After the time t3, a current will continue to flow through the loop of the choke coil L, smoothing capacitor C2 and flywheel diode D4. The smoothing capacitor C2 will continuously provide a DC output at output terminals 1A and 1B connected to a load.

At the time t3 when the magnetic flux $\phi_{T1}$ of the transformer T1 becomes extinct, the blocking oscillator will be in a state similar to that prevailing prior to the time t1, so that the transistor Q1 tends to be turned on, but according to the present invention, the transistor Q1 will be still maintained in an "off" state. This is because until the choke coil L completely gives off the excitation energy, a current continues to flow through the flywheel diode D4 so that such a voltage as represented by the first term at the right hand side of the expression (1) occurs in the base winding L13 of the transformer T1, and because of the presence of the voltage drop circuit R.

In the first term on the right hand side of the above expression (1), due to the fact that the currents flowing through the rectifier diode D3 and flywheel diode D4 are greatly different from each other, the forward voltage $V_4$ is higher than the forward voltage $V_3$, and the dotted end of the base winding L13 of the transformer T1 is at a lower potential. Thus, a starting current will be caused to flow from the resistor R1 to the resistor R2 and base winding L13 and prevented from flowing in the base of the transistor Q1. An oscillatory voltage will be generated when the magnetic flux $\phi_{T1}$ becomes extinct, and the amplitude of this voltage will also be prevented from exceeding the forward voltage $V_3$ of the rectifier diode D3 because of persistence of current flow through the flywheel diode D4. Thus, the oscillatory voltage will be absorbed by the forward voltages of the diodes D2 and D1, so that the base current of the transistor Q1 will be prevented from flowing in any direction.

The voltage drop circuit R will function as mentioned above, and thus the "off" state of the transistor Q1 will persist. When the excitation energy of the choke coil L is completely discharged and the voltage represented by the first term on the right hand side of the expression (1) vanishes, i.e., at time t4, the voltage $V_R$ of the voltage drop circuit R will become higher than the voltage $V_{BE1}$ so that the transistor Q1 will be turned on.

The voltage drop circuit R comprises the diode D1, diode D2, resistor R2 and resistor R3, and it is possible that the diodes D1 and D2 may be connected in reverse polarity and in parallel with each other, and that the resistors R2 and R3 may be replaced with a single resistor. It is also possible that the rectifier diode D3 and flywheel diode D4 may comprise a combination of a PN junction diode and Schottky barrier diode which have different forward voltages.

Figure 3:
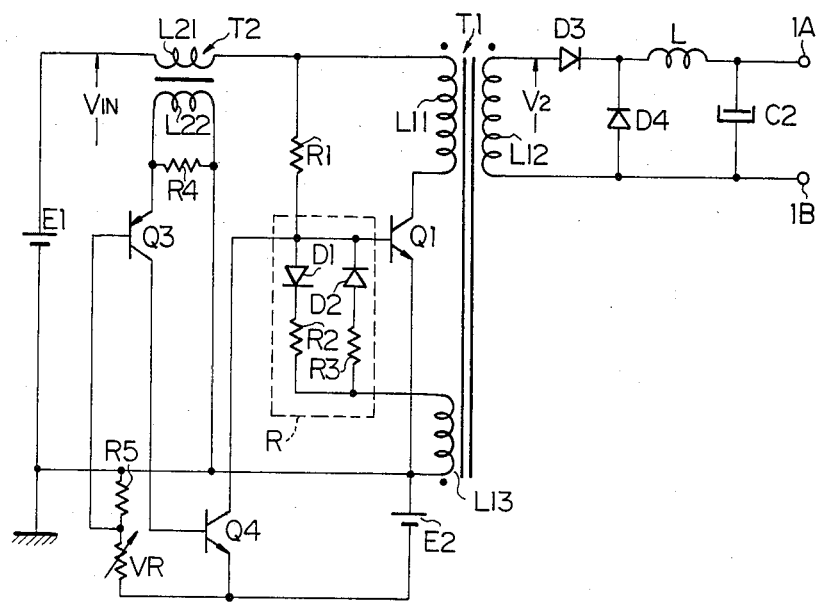
FIG. 3 is a circuit diagram showing the switching regulator according to another embodiment of the present invention.
Figure 4:
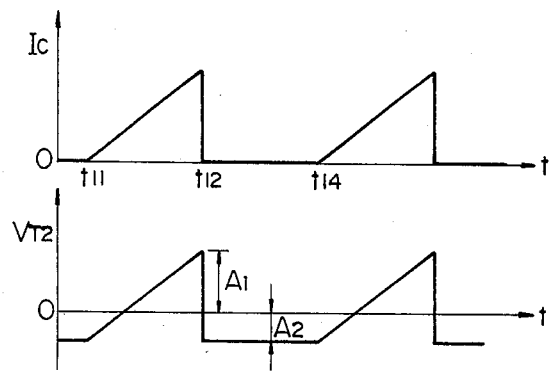
FIGS. 4, 5 and 6 are views illustrating the characteristics of the switching regulator shown in FIG. 3.

The switching regulator according to another embodiment of the present invention will next be described with reference to FIGS. 3 to 6. FIG. 3 is a circuit diagram showing the switching regulator; FIG. 4 illustrates collector current Ic of an oscillation transistor Q1 of FIG. 3, and a voltage $V_{T2}$ corresponding to collector current Ic detected by means of a current transformer; and FIG. 5 illustates the collector current Ic and collector voltage Vc of the oscillation transistor Q1, magnetic flux $\phi_{T1}$ of the transformer T1, and magnetic flux $\phi_L$ of a choke coil L. In FIG. 3, parts corresponding to those of FIG. 1 are indicated by like reference numerals and symbols.

According to this embodiment, there is provided a blocking oscillator which mainly comprises a transformer T1 having a primary winding L11 (referred to as collector winding hereinafter), secondary winding L12, and ternary winding L13 (referred to as base winding hereinafter); and an oscillation transistor Q1 connected in such a manner that a closed circuit is formed by the base-emitter thereof and base winding L13. The transistor Q1 has its emitter connected to one end of the base winding L13 and its base coupled to the other end thereof through a first series circuit of a diode D1 and resistor R2 and a second series circuit of a diode D2 and resistor R3, the first and second series circuits being connected in parallel with each other. The diode D1, resistor R2, diode D2 and resistor R3 constitute a single voltage drop circuit R which is arranged to block any forward or backward current when the voltage thereacross is in a micro-voltage range. The transistor Q1 has its base connected to the positive terminal of a DC power source E1 through resistor R1 and primary winding L21 of a current transformer T2. The primary winding L21 is also connected to one end of the collector winding L11 of the transformer T1, and a secondary winding L22 of the current transformer T2 is coupled at one end to the base of a transistor Q4 through the emitter and collector of a transistor Q3, the opposite end of the secondary winding L22 being connected to one end of the base winding L13. A resistor R4 is connected across the secondary winding L22. The collector of the transistor Q4 is connected to the base of the transistor Q1, and the emitter thereof is coupled to the negative terminal of another DC power source E2. The positive terminal of the DC power source E2 is connected to one end of the base winding L13.

The base of the transistor Q3 is connected to the connection point of a series circuit of a resistor R5 and variable resistor VR connected between the positive and negative terminals of the DC power source E2. The transistor Q3 is provided at its base with a voltage obtained by dividing the voltage of DC power source E2 by the resistor R5 and variable resistor VR, and at its emitter with a voltage which occurs across resistor R4. In this way, the transistor Q3 is enabled to serve as a voltage comparator switch. It is possible to decrease the voltage which occurs across the resistor R4, by reducing the value for the variable resistor VR so as to decrease the voltage at the voltge dividing point of the aforementioned series circuit of the resistors R5 and VR, while it is possible to increase the voltage which occurs across the resistor R4, by increasing the value for the variable resistor VR to increase the voltage at the above-mentioned voltage dividing point. The negative terminal of the DC power source E1 and positive terminal of the DC power source E2 are grounded. A rectifyingsmoothing circuit which may be similar to that provided in FIG. 1 is connected to the secondary winding L12 of the transformer T1.

The voltage across the voltage drop circuit R can also be set up in accordance with the aforementioned expression (1).

The operation of the switching regulator according to the second embodiment will now be described. Description will first be made of merits which can be obtained when the oscillation transistor Q1 which is under an oscillatory condition, is switched from an "off" state to an "on" state, with reference to FIG. 5 in which the abscissa axis represents time.

Because of only a small base current flowing through the resistor R1, a collector current Ic will be caused to flow through the transistor Q1. A voltage will be induced in the base winding L13 of the transformer T1 under the action of the mutual inductance with respect to the collector winding L11, so that the base potential of the transistor Q1 will be thereby biased forwardly. In this way, the collector current Ic of the transistor Q1 will be increased to be higher than before, and the thus increased collector current Ic will serve to increase the voltage induced in the base winding L13 so that the base current will become higher, thus further increasing the collector current Ic.

Due to the above regenerative action, the transistor Q1 will be turned on at time t11 so that the collector current Ic will continue increasing. A voltage corresponding to the collector current Ic detected across the resistor R4 will be applied to successively turn on the transistors Q3 and Q4, and thus the base current of the transistor Q1 will be by-passed through the transistor Q4, so that the collector current will now be stopped from increasing, and as a result, the magnetic flux $\phi_{T1}$ will no longer change; thus, the voltage induced in the base winding L13 of the transformer T1 will now begin decreasing. As the base current decreases, the collector current will decrease, and because of regenerative action reverse to the previous one, the transistor Q1 will be abruptly turned off at time t12.

Until immediately prior to the time t12 when the transistor Q1 is turned off, an excitation current will continue flowing through the collector current L11 of the transformer T1 so that the magnetic flux $\phi_{T1}$ will be accumulated therein; thus, because of the transistor Q1 being abruptly turned off, a counter electromotive force will be generated so that the transistor Q1 will be thereby biased reversely.

The reversely biased condition will persist until time t13 when the magnetic flux $\phi_{T1}$ becomes extinct.

When the transistor Q1 is in the "on" state, a current which will charge the smoothing capacitor C2 through the rectifier diode D3 and choke coil L, will be caused to flow through the secondary winding L12. Meanwhile, the magnetic flux $\phi_L$ will be accumulated in the choke coil L as excitation energy.

After the time t13, a current will continue flowing through the loop of the choke coil L, smoothing capacitor C2 and flywheel diode D4. The smoothing capacitor C2 will continuously provide a DC output at output terminals 1A and 1B connected to a load.

At the time t13 when the magnetic flux $\phi_{T1}$ of the transformer T1 becomes extinct, the blocking oscillator will be in a state similar to that prevailing prior to the time t11, so that the transistor Q1 tends to be turned on, but according to the present invention, the transistor Q1 will be still maintained in an "off" state. This is because until the choke coil L completely gives off the excitation energy, a current continues flowing through the flywheel diode D4 so that such a voltage as represented by the first term at the right hand side of the expression (1) occurs in the ternary winding L13 of the transformer T1, and because of the presence of the voltage drop circuit R, as in FIG. 1.

In the first term on the right hand side of the above expression (1), due to the fact that the currents flowing through the rectifier diode D3 and flywheel diode D4 are greatly different from each other, the forward voltage $V_4$ is higher than the forward voltage $V_3$, and the dotted end of the base winding L13 of the transformer T1 is at a lower potential. Thus, a starting current will be caused to flow from the resitor R1 to the resistor R2 and base winding L13 and prevented from flowing in the base of the transistor Q1. An oscillatory voltage will be generated when the magnetic flux $\phi_{T1}$ becomes extinct, and the amplitude of this voltage will also be prevented from exceeding the forward voltage $V_3$ of the rectifier diode D3 because of persistence of current flow through the flywheel diode D4. Thus, the oscillatory voltage will be absorbed by the forward voltages of the diodes D2 and D1, so that the base current of the transistor Q1 will be prevented from flowing in any direction.

The voltage drop circuit R will function as mentioned above, and thus the "off" state of the transistor Q1 will persist. When the excitation energy of the choke coil L is completely discharged and the voltage represented by the first term on the right hand side of the expression (1) vanishes, i.e., at time t14, the voltage $V_R$ of the voltage drop circuit R will become higher than the voltage $V_{BE1}$ so that the transistor Q1 will be turned on.

Description will next be made of merits provided when the transistor Q1 is switched from an "on" state to "off" state, with reference to FIG. 4, no such merits being obtainable with the embodiment shown in FIG. 1.

With the transistor Q3, a voltage $V_{t2}$ corresponding to the collector current Ic of the transistor Q1 detected in the secondary winding L22 of the current transformer T2 will be compared with the voltage $V_{BE3}$ between the base and the emitter of the transistor Q3 which is used as a reference voltage, and by successively turning on the transistor Q3 and Q4, the transistor Q1 will be turned off. In this way, a stable "on" state of the transistor Q1 will be maintained during a period of time $T_{ON}$ without being influenced by the characteristics such as $h_{fe}$ and so forth. The DC voltage between the output terminals 1A and 1B can be easily controlled by changing the reference voltage.

Figure 5:
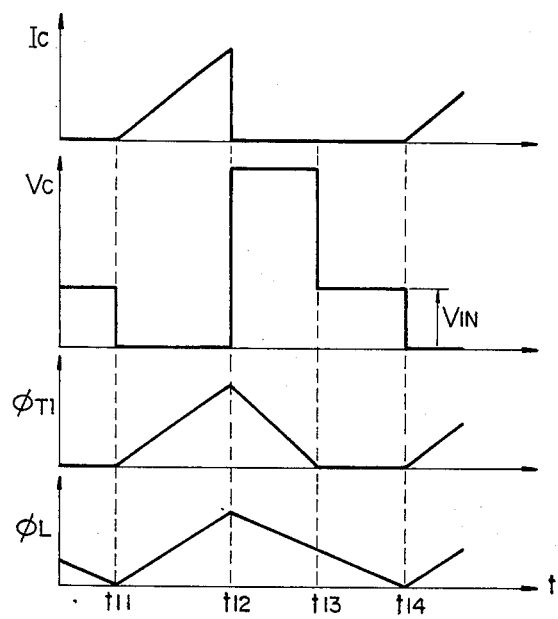

FIG. 4 illustrates the case where the duty ratio of the transistor Q1 is 50%, wherein the timing points corresponding to FIG. 5 are indicated by the same reference symbols. As will be apparent from FIG. 4, the DC component of the voltage $V_{T2}$ across the secondary winding L22 of the transformer T2 which varies like the collector current Ic, is eliminated, and only the AC component thereof is detected across the resistor R4. With the transistor Q3, the voltage $V_{BE3}$ and positive component of the voltage $V_{T2}$ will be compared with each other, and when the voltage $V_{T2}$ exceeds the voltage $V_{BE3}$, the transistor Q1 will be turned off. The timing when the transistor Q1 is turned on, depends on the rate with which the choke coil L gives off the magnetic flux $\phi_L$. The period of time during which the transistor Q remains turned off, varies with the output voltage.

Assuming that the amplitude of the positive component of the voltage $V_{T2}$ is $A_1$ and that the amplitude of the negative component thereof is $A_2$, the following equation (2) will hold true:

$$A_2 = (1/t14) \int_0^{t12} \{(A_1 + A_2)/t12\} t \cdot dt \quad (2)$$

$$= \{(A_1 + A_2)/t14 \cdot t12\}[t^2/2]_0^{t12}$$

$$= (t12/t14)(A_1 + A_2)/2$$

$$= A_p D/2$$

where $A_1 + A_2 = A_p$; and $D = t12/t14$ (duty ratio).

From the equation (2), the following equation (3) can be derived:

$$A_p = (A_p D/2) + A_1 \quad (3)$$

-continued
$$= A_1/(1 - D/2)$$

In the above equation (3), $A_p$ represents the amplitude of the collector current Ic detected by means of the resistor, and $A_1$ indicates that portion of the amplitude $A_p$ which is actually compared with the reference voltage at the transistor Q3. The relationship between the amplitudes $A_p$ and $A_1$ varies with the duty ratio D. In the case where the duty ratio is 50% as in FIG. 4, for example, $A_p = 4A_1/3$, and the value of $A_1$ will be 75% of $A_p$. If the duty ratio D is 0, then $A_1$ will be 100% of $A_p$.

Figure 6:
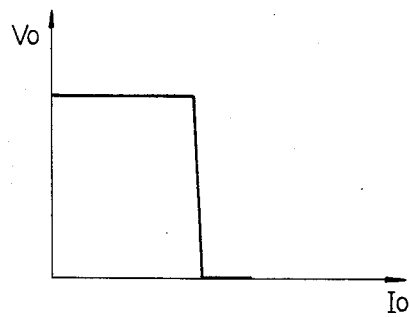

Thus, with such a design that the duty ratio D is about 50% for a normal load within the control range, the duty ratio will approach zero under an overload condition, i.e., when the load is out of the control range, since the output voltage will drop. In the control range, the amplitude $A_1$ which corresponds to 75% of the amplitude $A_p$ will be compared with the reference voltage, whereas outside the control range, as the duty ratio decreases and approaches zero, the amplitude $A_1$ which corresponds to 100% of $A_p$ will now be compared with the reference voltage. By virtue of the fact that the value to be compared is abruptly increased, it is possible to rapidly stop the output current Io from increasing. It is possible to achieve an overcurrent protecting function due to a so-called drooping characteristic such as shown in FIG. 6.

As discussed above, the switching regulator according to the present invention is designed such that any forward or backward current is blocked by the voltage drop circuit connected in the closed circuit defined between the base winding and the base-emitter of the transistor, when the voltage across the voltage drop circuit is in a microvoltage range which may occur before the excitation energy of the choke coil is discharged, and the oscillation transistor is turned "on" after the magnetic flux in the transformer of the blocking oscillator and that in the choke coil have become completely extinct. In this way, the oscillation transistor can be protected from being damaged by a surge current; thus, according to the present invention, it is possible to realize a self-excited on-on type switching regulator which can use a smaller transformer than that used with the flyback type, so that the configuration thereof can be miniaturized as a whole and the cost thereof can be further reduced.

Furthermore, with the switching regulator according to the present invention, it is possible to prevent an excessive surge current which tends to occur when the oscillator transistor is in the "on" state, as explained hereinbefore in connection with the embodiment of FIG. 3. Due to the fact that the timing when the transistor is turned "off" is determined by detecting the collector current in the current transformer and comparing the voltage resulting from the flow of the detected collector current, with the reference voltage, it is also possible to rapidly stop the output current from increasing with the aid of the overcurrent protecting function when the load becomes so heavy as to be out of the control range so that the duty ratio becomes correspondingly lower.

As will be appreciated from the above discussion, according to the present invention, a self-excited on-on type switching regulator is provided which can be constructed by using an oscillation transistor with a low current capacity, and by adding the overcurrent protecting function thereto, it is possible to further enhance the utility thereof.

While the invention has been illustrated and described with respect to specific embodiments thereof, it is to be understood that the invention is by no means limited thereto but encompasses all changes and modifications which will become possible within the scope of the appended claims.

I claim:

1. An on-on type switching regulator comprising:
   a blocking oscillator including a transformer having a collector winding, base winding and secondary winding, and a transistor;
   a rectifying-smoothing circuit comprising a rectifier diode, flywheel diode, choke coil, and smoothing capacitor, said rectifying-smoothing circuit being connected to said secondary winding; and
   a voltage drop circuit connected in a closed circuit formed between said base winding and the base-emitter of said transistor, said voltage drop circuit being arranged to block any forward or backward current when the voltage thereacross is in a microvoltage range which may occur before excitation energy in said choke coil is discharged.

2. A switching regulator according to claim 1, wherein said voltage drop circuit includes two series circuits each comprising a diode and resistor, said two series circuits being connected in parallel with each other in such a manner that the diodes are connected in reverse polarity with each other.

3. A switching regulator according to claim 1, wherein the collector current of the transistor constituting said blocking oscillator is transformed to a voltage by means of a current transformer, and when positive component of the voltage resulting from the transformation exceeds a reference voltage, said transistor is turned off.

4. A switching regulator according to claim 2, wherein the collector current of the transistor constituting said blocking oscillator is transformed to a voltage by means of a current transformer, and when positive component of the voltage resulting from the transformation exceeds a reference voltage, said transistor is turned off.

* * * * *